United States Patent
Renaud

(10) Patent No.: US 9,978,852 B2
(45) Date of Patent: May 22, 2018

(54) METHODS OF FABRICATING COMPLEMENTARY GALLIUM NITRIDE INTEGRATED CIRCUITS

(71) Applicant: Freescale Semiconductor, Inc., Austin, TX (US)

(72) Inventor: Philippe Renaud, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/251,114

(22) Filed: Aug. 30, 2016

(65) Prior Publication Data

US 2016/0372575 A1 Dec. 22, 2016

Related U.S. Application Data

(62) Division of application No. 13/964,778, filed on Aug. 12, 2013.

(51) Int. Cl.
*H01L 29/15* (2006.01)
*H01L 31/0256* (2006.01)
(Continued)

(52) U.S. Cl.
CPC ...... *H01L 29/66462* (2013.01); *H01L 21/266* (2013.01); *H01L 21/26546* (2013.01);
(Continued)

(58) Field of Classification Search
CPC ........... H01L 29/66462; H01L 29/7786; H01L 21/76224; H01L 21/26546; H01L 21/266;
(Continued)

(56) References Cited

U.S. PATENT DOCUMENTS 5,847,419 A * 12/1998 Imai ................. H01L 27/0605
257/190
8,470,652 B1  6/2013 Brown et al.
(Continued)

FOREIGN PATENT DOCUMENTS

| GB | 2482308 A | 2/2012 |
|---|---|---|
| JP | 2011 082331 A | 4/2011 |
| WO | 2013084020 A1 | 6/2013 |

OTHER PUBLICATIONS

Extended European Search Report dated Dec. 10, 2014 for correlating EP 141179991, 8 pages.
(Continued)

*Primary Examiner* — Ismail Muse
(74) *Attorney, Agent, or Firm* — Sherry W. Schumm

(57) ABSTRACT

An embodiment of a complementary GaN integrated circuit includes a GaN layer with a first bandgap. A second layer with a second bandgap is formed on the GaN layer, resulting in a 2DEG in a contact region between the GaN layer and the second layer. The second layer has a relatively thin portion and a relatively thick portion. A third layer is formed over the relatively thick portion of the second layer. The third layer has a third bandgap that is different from the second bandgap, resulting in a 2DHG in a contact region between the second layer and the third layer. A transistor of a first conductivity type includes the 2DHG, the relatively thick portion of the second layer, and the third layer, and a transistor of a second conductivity type includes the 2DEG and the relatively thin portion of the second layer.

20 Claims, 13 Drawing Sheets

(51) Int. Cl.
H01L 29/66 (2006.01)
H01L 29/778 (2006.01)
H01L 29/20 (2006.01)
H01L 21/8252 (2006.01)
H01L 27/06 (2006.01)
H01L 27/085 (2006.01)
H01L 21/265 (2006.01)
H01L 21/266 (2006.01)
H01L 21/761 (2006.01)
H01L 21/762 (2006.01)
H01L 27/092 (2006.01)

(52) U.S. Cl.
CPC ...... *H01L 21/761* (2013.01); *H01L 21/76224* (2013.01); *H01L 21/8252* (2013.01); *H01L 27/0605* (2013.01); *H01L 27/085* (2013.01); *H01L 29/2003* (2013.01); *H01L 29/66431* (2013.01); *H01L 29/778* (2013.01); *H01L 29/7786* (2013.01); *H01L 27/092* (2013.01)

(58) Field of Classification Search
CPC ............... H01L 21/761; H01L 21/8252; H01L 27/0605; H01L 27/085; H01L 29/2003; H01L 29/66431; H01L 29/778; H01L 27/092
See application file for complete search history.

(56) References Cited

U.S. PATENT DOCUMENTS

| | | | | |
|---|---|---|---|---|
| 2007/0018198 A1* | 1/2007 | Brandes | .............. | H01L 29/7787 257/183 |
| 2009/0121775 A1* | 5/2009 | Ueda | .................... | H01L 29/739 327/427 |
| 2011/0275173 A1* | 11/2011 | Khaja | ................. | H01L 21/2654 438/34 |
| 2012/0007145 A1* | 1/2012 | Chen | ............... | H01L 21/823412 257/192 |
| 2013/0043485 A1 | 2/2013 | Ueno | | |
| 2013/0248933 A1* | 9/2013 | Ikeda | .................. | H01L 29/7786 257/194 |
| 2014/0034962 A1 | 2/2014 | Curatola et al. | | |
| 2014/0091310 A1 | 4/2014 | Jeon et al. | | |
| 2014/0091311 A1* | 4/2014 | Jeon | ...................... | H01L 29/205 257/76 |
| 2014/0264380 A1* | 9/2014 | Kub | .................. | H01L 29/41725 257/77 |
| 2014/0374765 A1* | 12/2014 | Curatola | ............. | H01L 29/7783 257/76 |

OTHER PUBLICATIONS

Alexandrov, D., "Complementary Field Effect Transistors for VLSI Design on GAN and Related Alloys", CCECE 2003—CCGEI2003, IEEE, Aug. 3, 2003, pp. 311-314.

Cooke, M., "Two-dimensional hole gas with increased density and mobility", Semiconductor Today, Compounds & Advanced Silicon, Dec. 24, 2013, pp. 1-2.

Mustafa, N.A., et al., "The coexistence of two-dimensional electron and hole gases in GaN-Based heterostructures", AIP, Journal of Applied Physics, 111,044512, AIP Publishing LLC, American Institute of Physics, 2012, pp. 1-7.

Hackenbuchner, S., et al., "Polarization induced 2D hole gas in GaN/AlGaN heterostructures", Elsevier Science B.V., Journal of Cyrstal Growth 230 (2001) 607-610.

Shatalov, M., et al., "GaN/AlGaN p-ChannelInverted Heterostructure JFET", IEEE Electron Device Letters, vol. 23, No. 8, Aug. 2002,pp. 452-454.

Nakajima, A., et al., "High Density Two-Dimensional Hole Gas Induced by Negative Polarization at GaN/AlGaN Heterointerface", Applied Physics Express 3 (2010) 121004, Dec. 10, 2010, pp. 1-3.

* cited by examiner

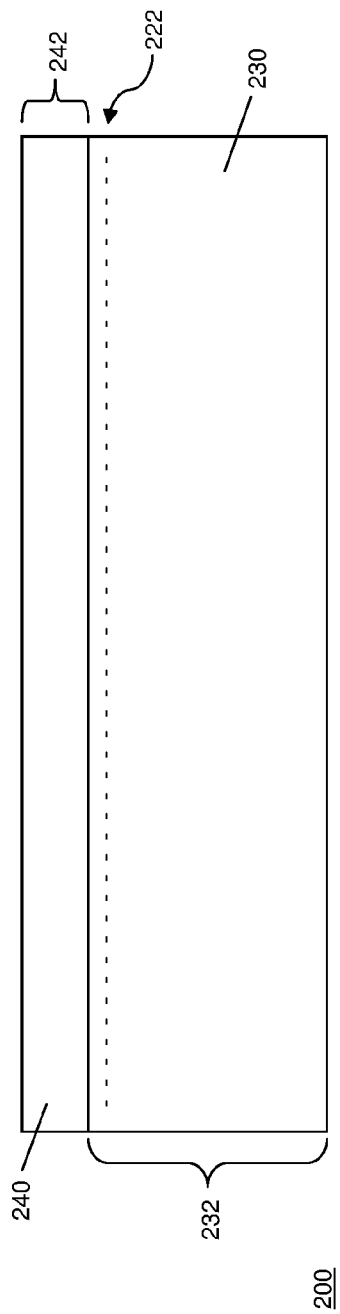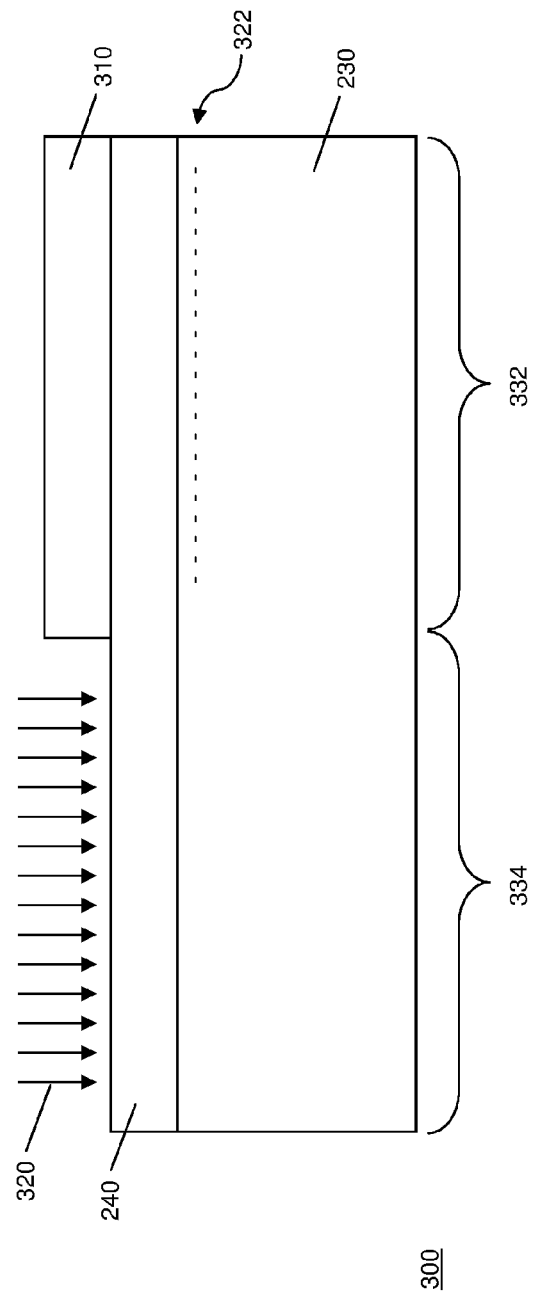

METHODS OF FABRICATING COMPLEMENTARY GALLIUM NITRIDE INTEGRATED CIRCUITS

RELATED APPLICATION

This application is a divisional of co-pending, U.S. patent application Ser. No. 13/964,778, filed on Aug. 12, 2013.

TECHNICAL FIELD

Embodiments of the subject matter described herein relate generally to gallium nitride (GaN) integrated circuits that include multiple transistors.

BACKGROUND

A GaN high electron mobility transistor (HEMT) is a type of field effect transistor in which a heterojunction, rather than a doped region, provides the conductive channel of the transistor. In such a HEMT, the heterojunction (or the channel) exists in a contact region between two layers of semiconductor materials having different bandgaps. For example, in a gallium nitride (GaN)-based HEMT, a two-dimensional electron gas (2DEG) may be present within a contact region between a GaN substrate and a barrier layer (e.g., an aluminum GaN (AlGaN) layer). The 2DEG essentially is a concentration of electrons at the heterojunction that are free to move in two dimensions (i.e., along the heterojunction), but not in the third dimension (i.e., vertically through the device). Current associated with the 2DEG may flow between contacts positioned at spatially separated locations above the heterojunction. Although GaN-based HEMTs have been found to be particularly well suited for high power, high speed switching applications, GaN technologies do present some challenges to designers, when compared with more conventional semiconductor technologies (e.g., silicon-based technologies).

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 2-6 illustrate cross-sectional, side views of a series of fabrication steps for producing the complementary GaN integrated circuit of FIG. 1, in accordance with an example embodiment;

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
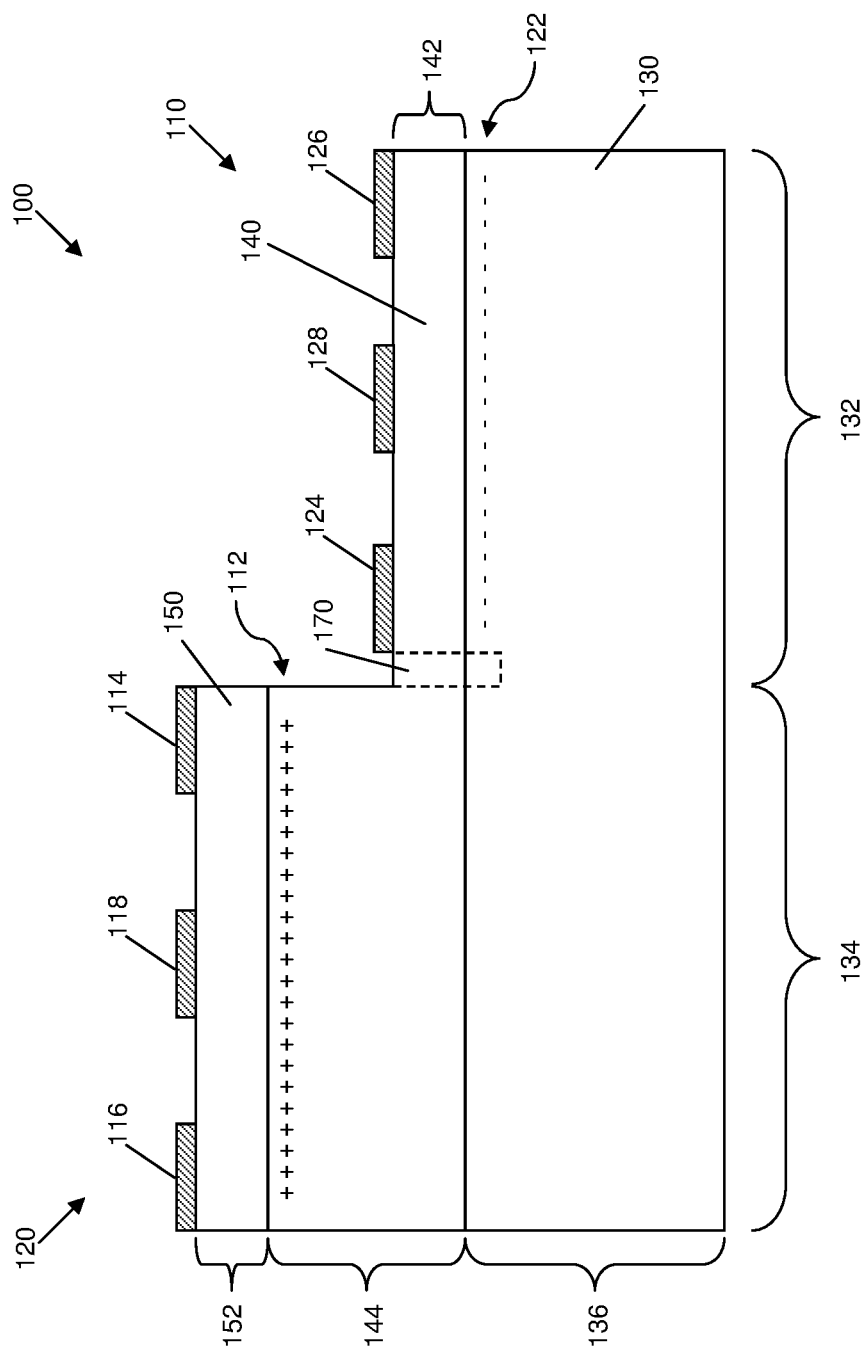
FIG. 1 is a cross-sectional, side view of a portion of a complementary GaN integrated circuit, in accordance with an example embodiment.

FIG. 1 is a cross-sectional, side view of a portion of a complementary GaN integrated circuit (IC) 100, in accordance with an example embodiment. IC 100 includes a first GaN layer 130, a second layer 140, a third layer 150, and a plurality of contacts 114, 116, 118, 124, 126, 128, according to an embodiment. As will be described in more detail below, IC 100 includes a first transistor 110 of a first conductivity type (e.g., N-channel or N-type) in and on a first region 132 of the GaN layer 130, and a second transistor 120 of a second and different conductivity type (e.g., P-channel or P-type) in and on a second region 134 of the GaN layer 130. Because transistors 110, 120 are formed on a same semiconductor layer (i.e., GaN layer 130), IC 100 and transistors 110, 120 are considered to be monolithic. Further, because transistors 110, 120 are of different conductivity types, IC 100 also may be considered to be a "complementary IC" (i.e., a monolithic IC having transistors of different conductivity types). Additionally, since the base layer upon which transistors 110, 120 are formed is a GaN layer 130, IC 100 may be referred to herein as a "complementary GaN IC."

A top portion of GaN layer 130 may function as a channel layer for transistor 110, as will be described in more detail below. GaN layer 130 may have a thickness 136 in a range of about 2.0 microns to about 10.0 microns, in an embodiment. Alternatively, GaN layer 130 may be thicker or thinner. To enhance mechanical stability of the GaN IC 100, GaN layer 130 may be formed using gallium nitride epitaxy on another base substrate (not shown in FIG. 1) (e.g., a bulk GaN substrate, a silicon substrate, a silicon carbide (SiC) substrate, a sapphire substrate, and so on). In other words, a base substrate that may be used to enable the epitaxial growth of the first GaN layer 130 can be formed from a material selected from GaN, silicon, SiC, or any other suitable material. In an alternate embodiment, GaN layer 130 may include the base substrate, itself. Accordingly, the term "GaN layer," as used herein, may refer to a GaN substrate or a GaN layer grown on a base substrate. According to an embodiment, GaN layer 130 may be formed from GaN with no dopants or a very minimal amount of dopants. Alternatively, GaN layer 130 may have a relatively small percentage of dopants for substrate tuning purposes. For example, GaN layer 130 may include up to about 1.0 atomic percent of aluminum (Al), indium (In), or other elements. GaN layer 130 may also include various dopant percentages, as well.

Second layer 140, which may be considered an n-type donor supply layer, is formed over a top surface of GaN layer 130. Second layer 140 may be formed, for example, from an alloy of the group-III nitrides, in an embodiment. For example, second layer 140 may be formed from a material selected from an AlGaN alloy, an InAlN alloy, an InGaN alloy, or another suitable alloy. According to a specific embodiment, second layer 140 may be formed from an AlGaN alloy having an atomic percentage of aluminum in a range of about 20 percent to about 30 percent. In alternate embodiments, the percentage of aluminum may be lower or higher.

GaN layer 130 has a first bandgap, and second layer 140 has a second, relatively wider bandgap. For example, GaN layer 130 may have a bandgap of about 3.4 electron volts (eV) (for unstrained GaN at 295 degrees Kelvin), and second layer 140 may have a bandgap of about 4.0 eV (for an unstrained barrier layer material). The bandgap of the second layer 140 may be lower or higher, in other embodiments. In any event, the bandgap of GaN layer 130 and the bandgap of second layer 140 are different from each other. Accordingly, formation of second layer 140 over GaN layer 130 results in the formation of a two dimensional electron gas (2DEG) 122 (i.e., a concentration of highly mobile electrons) at a contact region between GaN layer 130 and second layer 140. As will be described in more detail later, the 2DEG 122 is located in a region corresponding to a conductive channel of transistor 110, and the 2DEG 122 may provide a current that flows between current carrying electrodes 124, 126 of transistor 110. In the embodiment of IC 100 illustrated in FIG. 1, the 2DEG 122 is present in region 132 of GaN layer 130, as it is important for the functioning of N-channel transistor 110, but the 2DEG 122 has been suppressed in region 134 of GaN layer 130 (i.e., underlying P-channel transistor 120). In an alternate embodiment, as will be explained in conjunction with FIGS. 7-11, the 2DEG alternatively may be allowed to remain underlying the P-channel transistor.

According to an embodiment, a first portion of second layer 140 overlying the first region 132 of GaN layer 130 has a first thickness 142, and a second portion of second layer 140 overlying the second region 134 of GaN layer 130 has a second thickness 144 that is greater than the first thickness 142. For example, the first thickness 142 may be in a range of about 15 nanometers (nm) to about 30 nm, and the second thickness 144 may be in a range of about 40 nm to about 100 nm. In other embodiments, the first and second thicknesses 142, 144 may be smaller or larger than the above given ranges.

Third layer 150 is formed over a top surface of the second portion of second layer 140 (i.e., over the second region 144 of GaN layer 130). Third layer 150 may be formed, for example, from a semiconductor material (e.g., GaN) doped with a p-type dopant (e.g., magnesium (Mg), carbon (C), and so on), in an embodiment. In a specific example embodiment, for example, third layer 150 may be formed from GaN doped with Mg, where the Mg doping concentration is in a range of about $1.0 \times 10^{17}$ cm$^{-3}$ to about $1.0 \times 10^{20}$ cm$^{-3}$. In alternate embodiments, the Mg doping concentration may be lower or higher. Third layer 150 has a thickness 152 in a range of about 10 nm to about 30 nm, in an embodiment. Alternatively, third layer 150 may be thinner or thicker.

Third layer 150 has a third bandgap that is different from the second bandgap of second layer 140, in an embodiment. For example, third layer 150 may have a bandgap of about 3.5 eV (for an unstrained material). The bandgap of the third layer 150 may be lower or higher, in other embodiments. In any event, the bandgap of third layer 150 and the bandgap of second layer 140 are different from each other. Accordingly, formation of third layer 150 over second layer 140 results in the formation of a two dimensional hole gas (2DHG) 112 (i.e., a concentration of holes) at a contact region between third layer 150 and second layer 140. As will be described in more detail later, the 2DHG 112 is located in a region corresponding to a conductive channel of transistor 120, and the 2DHG 112 may enable a current to flow between current carrying electrodes 114, 116 of transistor 120.

Transistor 110 may be considered an electron field effect transistor (e.g., a HEMT), and conversely, transistor 120 may be considered a hole field effect transistor. Transistor 110, as illustrated, is a "normally on" transistor, in that current may flow between current conducting contacts 124, 126 in the absence of an electric field that would otherwise interfere with the continuity of 2DEG 122, and thus with conduction of current between current conducting contacts 124, 126. According to an embodiment, an electric field sufficient to interrupt current conduction between contacts 124, 126 may be produced through application of a voltage or current to channel control contact 128, which is positioned between the current carrying contacts 124, 126 and over the 2DEG 122. Similarly, transistor 120, as illustrated, is a "normally on" transistor, in that current may flow between current conducting contacts 114, 116 in the absence of an electric field that would otherwise interfere with the continuity of 2DHG 112, and thus with conduction of current between current conducting contacts 114, 116. According to an embodiment, an electric field sufficient to interrupt current conduction between contacts 114, 116 may be produced through application of a voltage or current to channel control contact 118, which is positioned between the current carrying contacts 114, 116 and over the 2DHG 112. In alternate embodiments, the structure of transistor 110 and/or transistor 120 may be modified so that either or both transistors 110, 120 are "normally off" transistors.

Along with transistors 110, 120, IC 100 may include any combination of additional active and/or passive devices, including any combination of N-channel transistors (e.g., transistors similar to transistor 110), P-channel transistors (e.g., transistors similar to transistor 120), diodes, resistors, capacitors, inductors, and so on, along with conductive interconnections between the various devices. In addition, although transistors 110, 120 are illustrated as being directly adjacent to each other, transistors 110, 120 may be spatially separated from each other (although still on the same layer 130) with any number of intervening devices, and/or one or more isolation structures may be present between transistors 110, 120. For example, an isolation structure may be present in the area indicated by dashed box 170. In various embodiments, the isolation structure may include an isolation mesa, an implant region or well, and/or a trench isolation structure.

FIGS. 2-6 illustrate cross-sectional, side views of a series of fabrication steps for producing the complementary GaN IC 100 of FIG. 1, in accordance with an example embodiment. Referring first to FIG. 2 and step 200, the method includes forming a first sub-layer 240 over a top surface of a first GaN layer 230 (e.g., GaN layer 130, FIG. 1). According to an embodiment, the first sub-layer 240 is formed directly on the top surface of GaN layer 230 by epitaxy. As discussed previously, the GaN layer 230 can also be an epitaxial grown layer on a base substrate as a GaN substrate, a silicon substrate, a SiC substrate, a sapphire substrate, and so on. Alternatively, GaN layer 230 itself may be a substrate.

In any event, the first sub-layer 240 may have a thickness 242 in a range of about 15 nm to about 30 nm, although the first sub-layer 240 may be thicker or thinner, as well. The first sub-layer 240 may be formed, for example, from an alloy of the group-III nitrides, in an embodiment (e.g., an AlGaN alloy, an InGaN alloy, an InAlN alloy, or another suitable alloy).

According to an embodiment, GaN layer 230 has a bandgap that is narrower than the bandgap of the first sub-layer 240. As discussed previously, this results in a 2DEG 222 being formed in a contact region between the GaN layer 230 and the first sub-layer 240.

Referring now to FIG. 3 and step 300, a patterned photoresist mask is applied to the top surface of the first sub-layer 240, so that mask material 310 is present on the first sub-layer 240 over a first region 332 of GaN layer 230, and an opening in the mask material is present over a second region 334 of GaN layer 230, thus exposing a portion of the first sub-layer 240. An ion implementation process is then performed, in order to implant ions 320 through the first sub-layer 240 to at least the depth of the 2DEG 222. The ion implantation process results in the suppression of the 2DEG 222 in the second region 334 of GaN layer 230. Accordingly, this results in a modified 2DEG 322 that is present in the first region 332 of GaN layer 230, but that is suppressed in the second region 334 of GaN layer 230. According to various embodiments, the parameters of the ion implementation process and the ions 320 selected for the ion implementation process are such that the ion implementation process causes physical damage to the structure of the crystalline semiconductor materials. More specifically, the ion implementation process results in the formation of traps in the contact region between the GaN layer 230 and the first sub-layer 240 within the second region 334 of the GaN layer 230.

According to an embodiment, the ions 320 for the ion implementation process are selected so as not to create a charge in the first sub-layer 240 or the contact region. For example, the ions 320 may be selected from oxygen (O), argon (Ar), or other ions having non-charge-producing characteristics. Alternatively, the ions 320 may include materials that may create a charge in the first sub-layer 240 and the contact region. For example, in alternate embodiments, the ions 320 may be selected from magnesium (Mg), carbon (C), or other ions having charge-producing characteristics.

Figure 4:
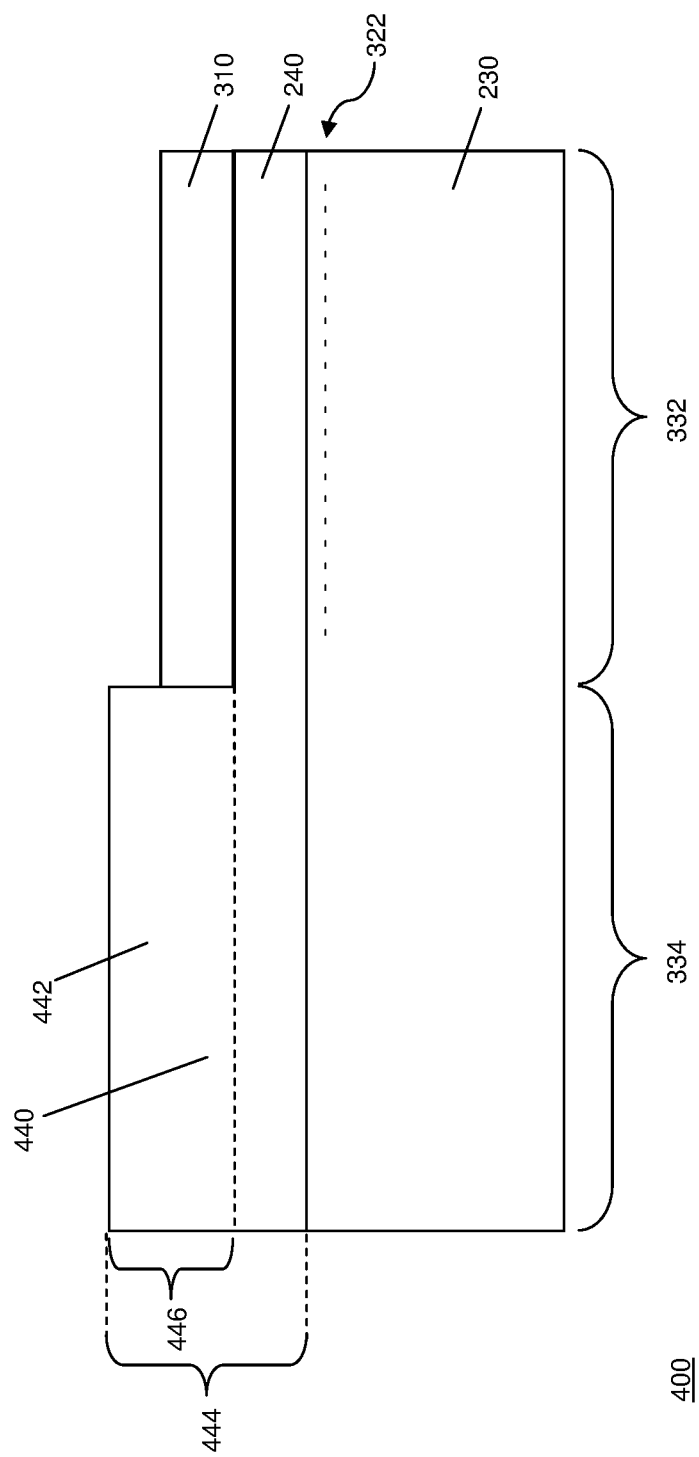

Referring now to FIG. 4 and step 400, a second sub-layer 442 is formed over the unmasked portion of the first sub-layer 240 (i.e., the portion of the first sub-layer 240 that is above the second region 334 of the GaN layer 230). The second sub-layer 442 may be formed from the same material or from a different material as the first sub-layer 240. A boundary between the first and second sub-layers 240, 442 is indicated by a dashed line, in FIG. 4. This line is not reproduced in subsequent figures, as no actual boundary may be present when the materials for the first and second sub-layers 240, 442 are the same.

According to an embodiment, the second sub-layer 442 is formed directly on the top surface of the first sub-layer 240 by epitaxy. The second sub-layer 442 may have a thickness 446 in a range of about 25 nm to about 70 nm, so that the combined thickness 444 of the first and second sub-layers 240, 442 is in a range of about 40 nm to about 70 nm. The second sub-layer 442 may be thicker or thinner, as well. Formation of the second sub-layer 442 results in a second layer 440 (e.g., second layer 140, FIG. 1) having a variable thickness, which overlies the first GaN layer 230. More specifically, a first portion of second layer 440 overlying the first region 332 of GaN layer 230 has a first thickness 242, and a second portion of second layer 440 overlying the second region 334 of GaN layer 230 has a second thickness 444 that is greater than the first thickness 242. According to an embodiment, the selective epitaxy that results in the formation of second layer 440 can be performed using a mask material 310 such as silicon dioxide, silicon nitride or another suitable material which: 1) can be easily removed at a later fabrication step by selective wet or dry etching; 2) can withstand epitaxy temperature growth; and 3) does not allow the occurrence of epitaxy on its top surface.

Figure 5:
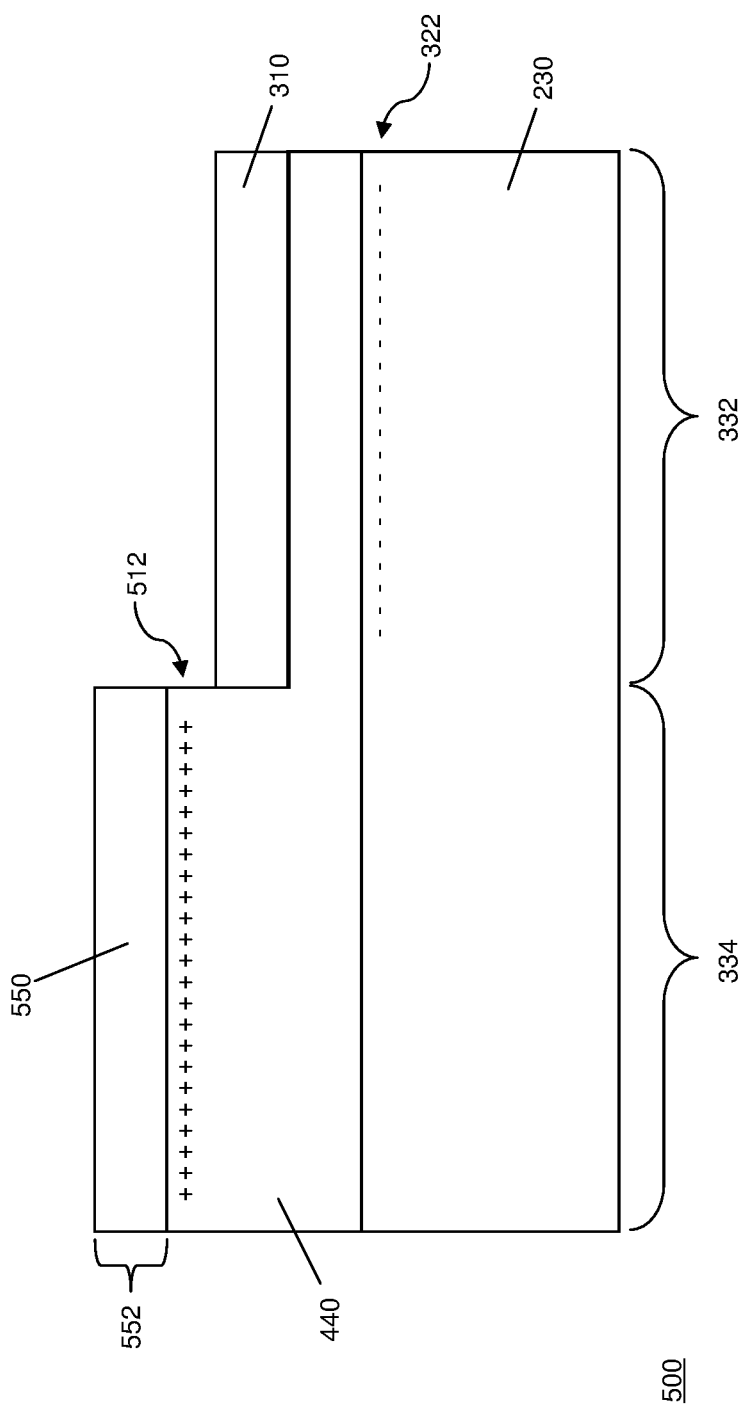

Referring now to FIG. 5 and step 500, a third layer 550 is formed over a top surface of second layer 440 (i.e., over the second region 344 of GaN layer 230). According to an embodiment, third layer 550 is formed by epitaxy directly on the top surface of the second layer 440. With mask material 310 still in place, third layer 550 is present only over the second region 334 of the GaN layer 230, and not over the first region 332 of GaN layer 230. Third layer 550 has a thickness 552 in a range of about 10 nm to about 30 nm, in an embodiment. Alternatively, third layer 550 may be thinner or thicker.

As discussed previously, third layer 550 may be formed, for example, from a semiconductor material (e.g., GaN) doped with a p-type dopant, in an embodiment. As also discussed previously, third layer 550 has a third bandgap that is different from the second bandgap of second layer 440. Accordingly, formation of third layer 550 over second layer 440 results in the formation of a 2DHG 512 in a contact region between third layer 550 and second layer 440.

Figure 6:
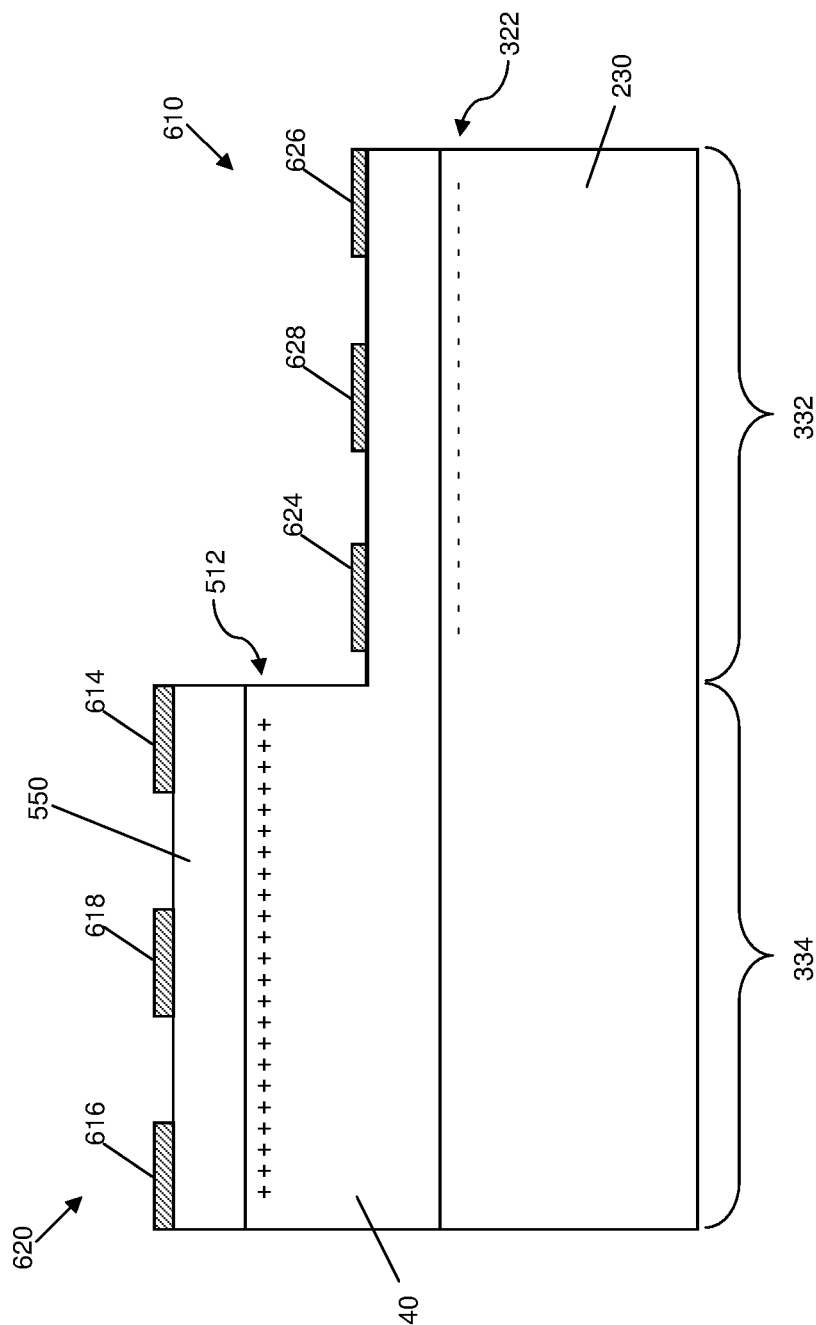

Referring now to FIG. 6 and step 600, the mask material 310 may be removed, and a plurality of conductive contacts 614, 616, 618, 624, 626, 628 may be formed over third layer 550 and second layer 240, respectively. More specifically, to form a first, N-channel transistor 610, current conducting contacts 624, 626 are formed over 2DEG 322 on a portion of second layer 240 that overlies the first region 332 of GaN layer 230, and a channel control contact 628 is formed between the current conducting contacts 624, 626. The first transistor 610 thus includes the portion of second layer 440 overlying the first region 332, the 2DEG 322, the current carrying contacts 624, 626, and the channel control contact 628. Similarly, to form a second, P-channel transistor 620, current conducting contacts 614, 616 are formed over 2DHG 512 on third layer 550, and a channel control contact 618 is formed between the current conducting contacts 614, 616. The second transistor 620 thus includes the third layer 550, the portion of second layer 440 overlying the second region 334, the 2DHG 512, the current carrying contacts 614, 616, and the channel control contact 618. As will be discussed in conjunction with FIGS. 12-17, various additional circuit elements (e.g., conductive lines and vias, and various active and passive devices) may then be electrically coupled to the first and second transistors 610, 620 to form various types of electrical circuits.

FIGS. 2-6 illustrate a method of fabricating a complementary GaN IC (e.g., IC 100, FIG. 1) in which two epitaxial processes are used to form the second layer (e.g., second layer 140, 440, FIGS. 1, 4). In an alternate embodiment, which will be described in conjunction with FIGS. 7-11, a single epitaxial process followed by a selective etching process may be used to form the second layer (e.g., second layer 1040, FIG. 10).

More specifically, FIGS. 7-11 illustrate cross-sectional, side views of a series of fabrication steps for producing an embodiment of a complementary GaN IC (e.g., GaN IC

Figure 7:
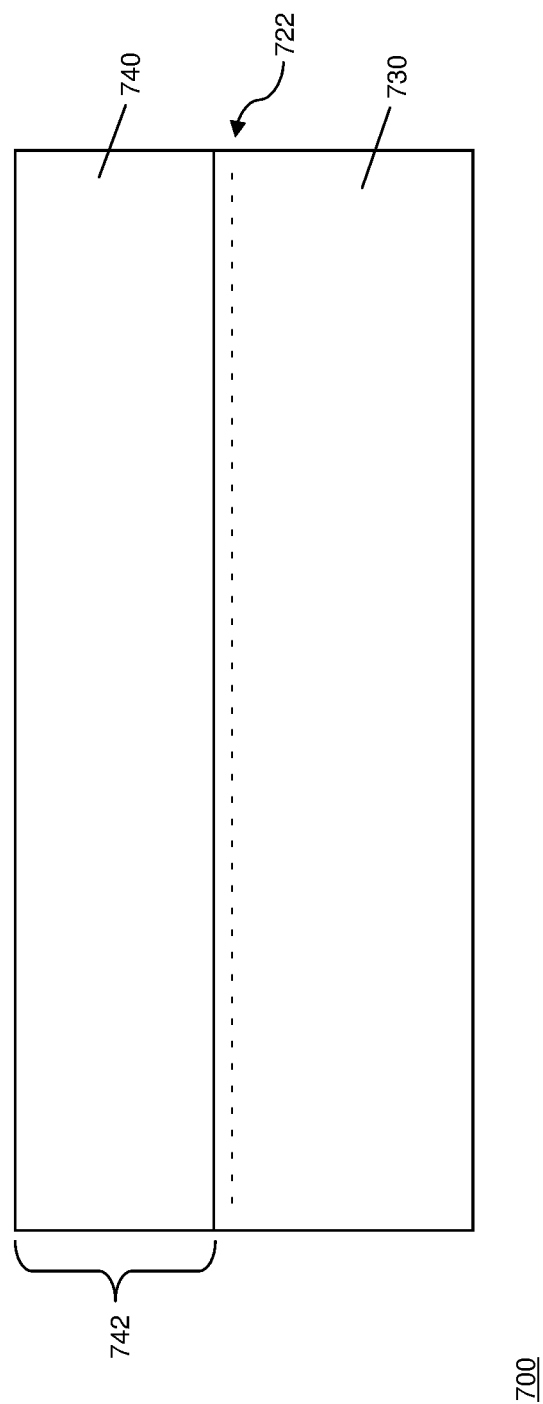
FIGS. 7-11 illustrate cross-sectional, side views of a series of fabrication steps for producing an embodiment of a complementary GaN integrated circuit, in accordance with another example embodiment.
Figure 11:
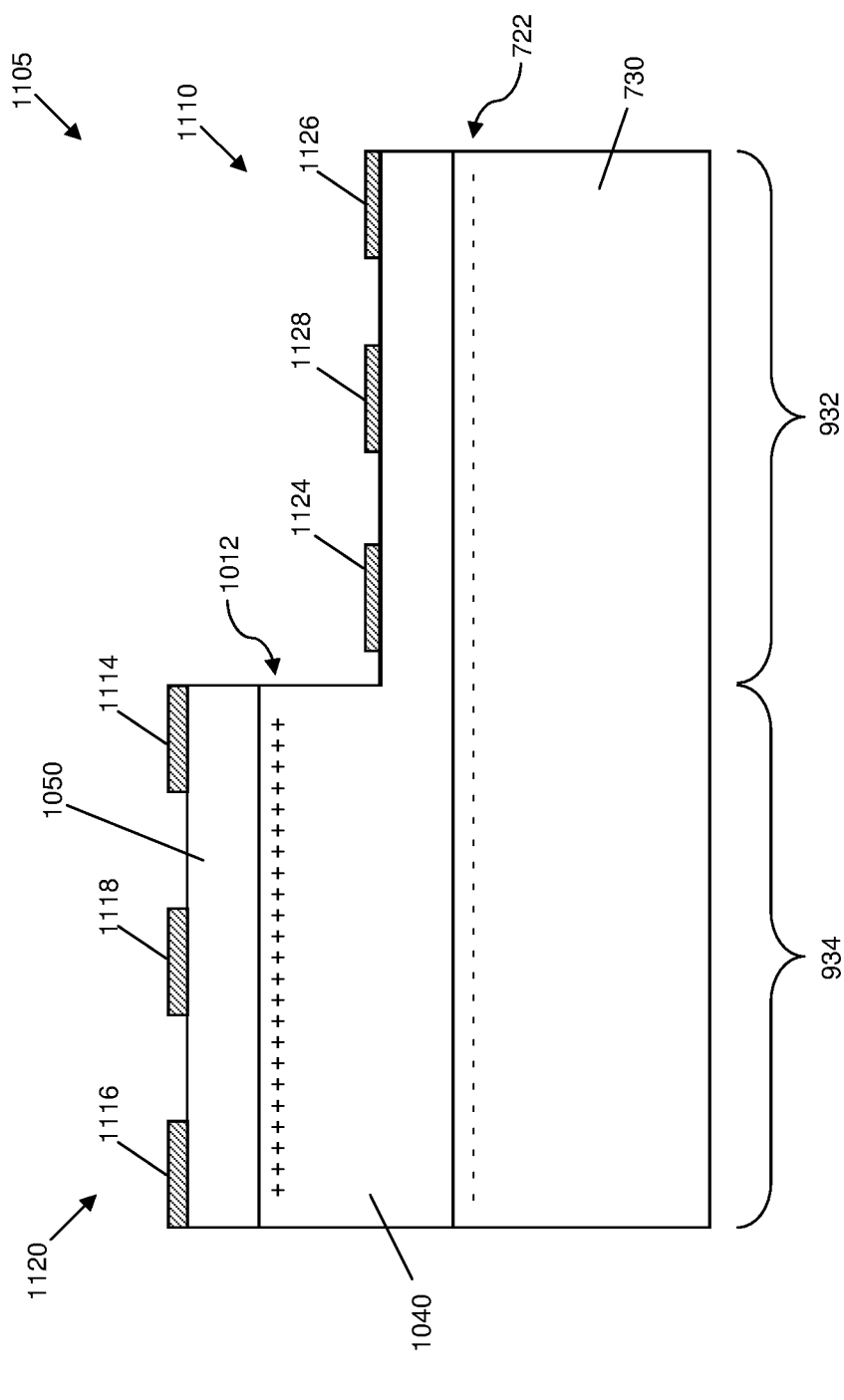

1105, FIG. 11), in accordance with another example embodiment. Referring first to FIG. 7 and step 700, the method includes forming a relatively thick second layer 740 over a top surface of a first GaN layer 730 (e.g., GaN layer 130, FIG. 1). According to an embodiment, the second layer 740 is formed directly on the top surface of GaN layer 730 by epitaxy. As discussed previously, the GaN layer 730 can also be an epitaxial grown layer on a base substrate as a GaN substrate, a silicon substrate, a SiC substrate, a sapphire substrate, and so on. Alternatively, GaN layer 730 itself may be a substrate. In any event, the second layer 740 may have a thickness 742 in a range of about 40 nm to about 100 nm, although the second layer 740 may be thicker or thinner, as well. The second layer 740 may be formed, for example, from an alloy of the group-III nitrides, in an embodiment (e.g., an AlGaN alloy, an InGaN alloy, InAlN alloy or another suitable alloy).

As with the previously described embodiments, GaN layer 730 may have a bandgap of about 3.5 eV, and second layer 740 has a relatively wider bandgap. Accordingly, this results in a 2DEG 722 being formed in a contact region between the GaN layer 730 and the second layer 740.

Figure 8:
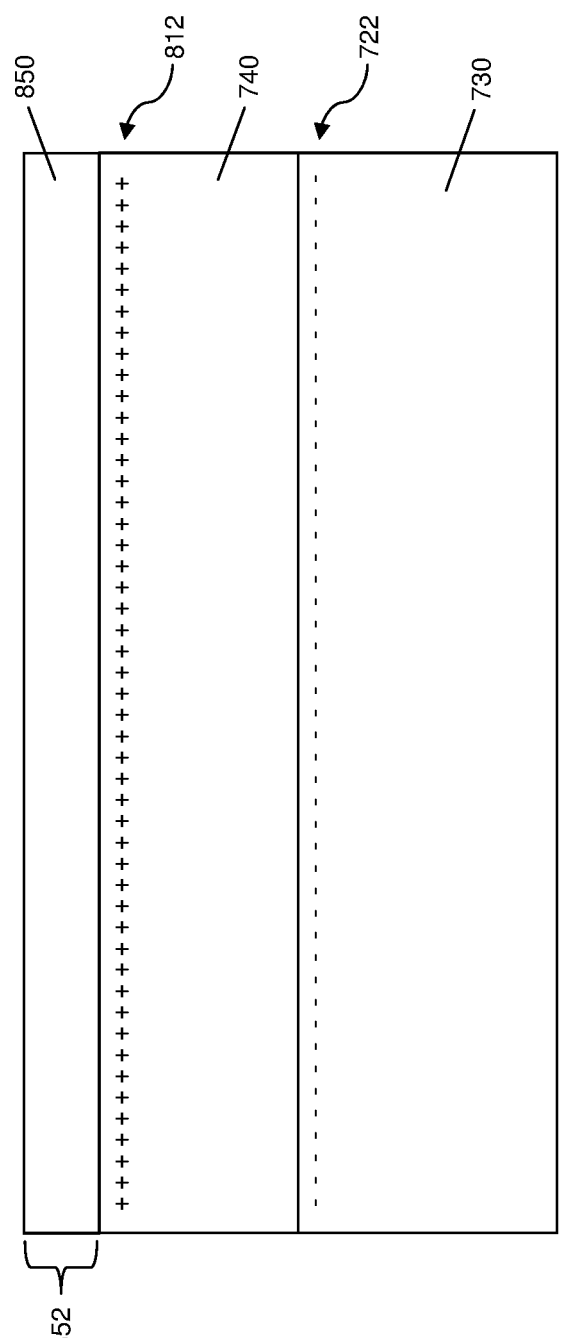

Referring now to FIG. 8 and step 800, a third layer 850 is formed over a top surface of second layer 740. According to an embodiment, third layer 850 is formed by epitaxy directly on the top surface of the second layer 740. Third layer 850 has a thickness 852 in a range of about 10 nm to about 30 nm, in an embodiment. Alternatively, third layer 850 may be thinner or thicker.

As discussed previously, third layer 850 may be formed, for example, from a semiconductor material (e.g., GaN) doped with a p-type dopant, in an embodiment. As also discussed previously, third layer 850 has a third bandgap that is different from the second bandgap of second layer 740. Accordingly, formation of third layer 850 over second layer 740 results in the formation of a 2DHG 812 in a contact region between third layer 850 and second layer 740.

Figure 9:
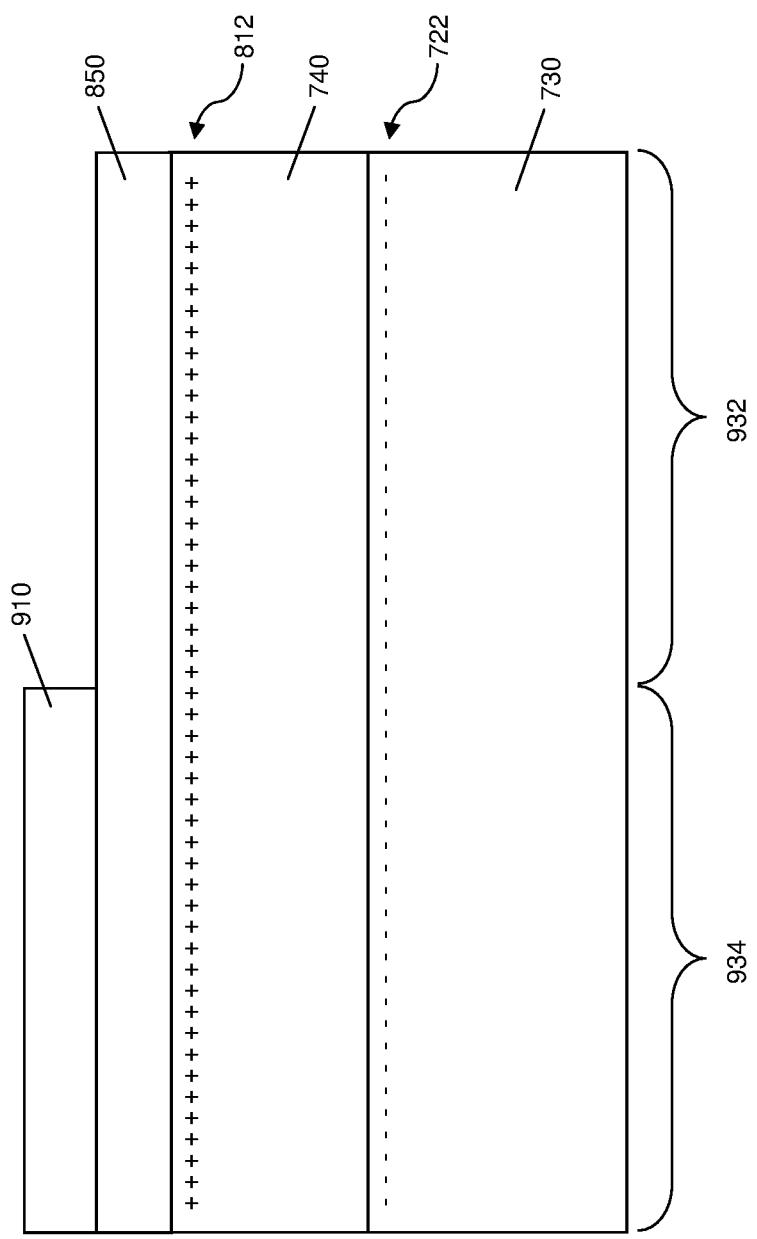

Referring now to FIG. 9 and step 900, a patterned etch mask is applied to the top surface of the third layer 850, so that mask material 910 is present on the third layer 850 over a second region 934 of GaN layer 730, and an opening in the mask material is present over a first region 932 of GaN layer 730, thus exposing a portion of the third layer 850. A selective etch process is then performed using an etchant that is selective to the material of the third layer 850 and the second layer 740. The etch process is terminated before the second layer 740 is etched through entirely.

Figure 10:
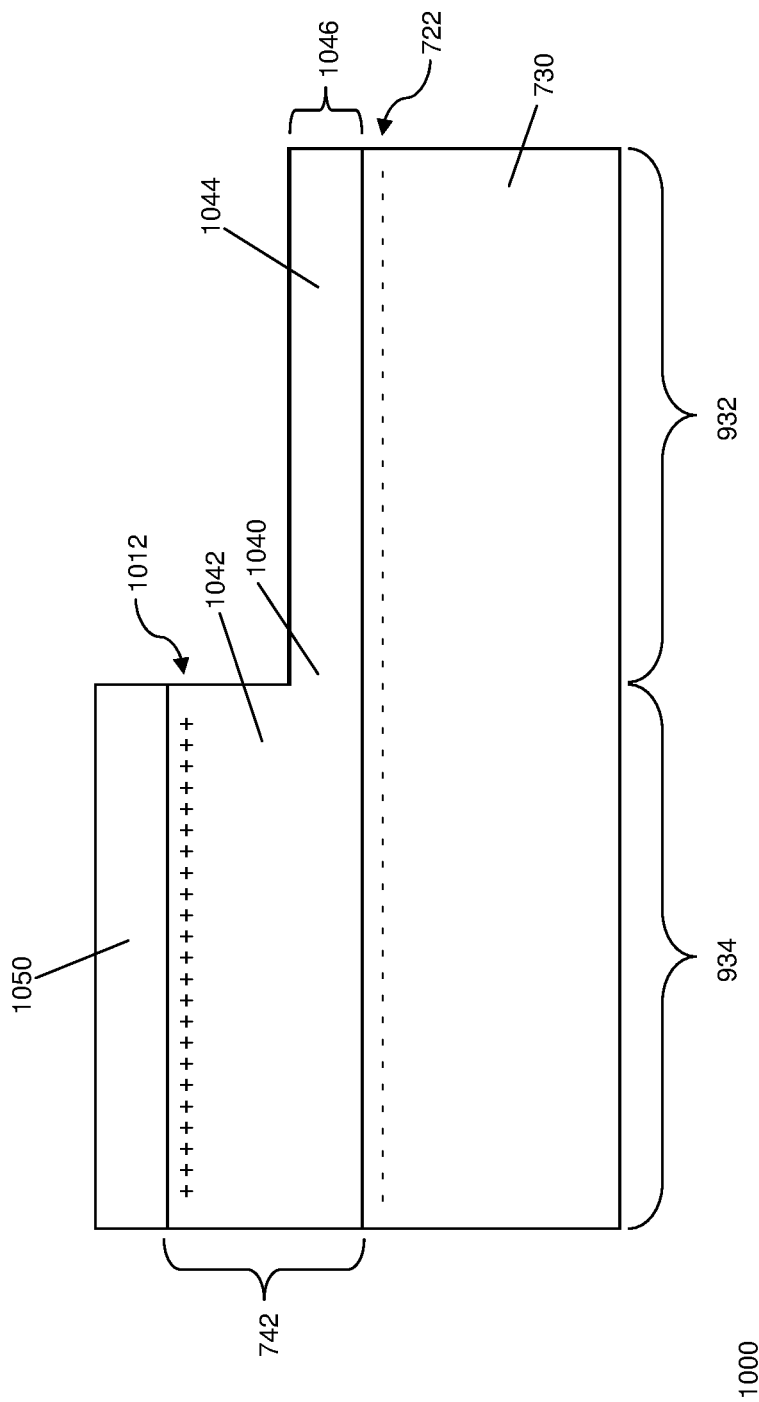

Referring to FIG. 10 and step 1000, with the mask material 910 removed, the etching process yields a modified second layer 1040 that includes a first portion 1044 having the original thickness 742, and a second portion 1044 having a second thickness 1046. According to an embodiment, the second thickness 1046 is in a range of about 15 nm to about 30 nm, although the second thickness 1046 may be larger or smaller, as well. In addition, the etching process yields a modified third layer 1050 and a modified 2DHG 1012 that are present only over the second region 934 of the GaN substrate 730, and not over the first region 932 of the GaN substrate 730.

Referring now to FIG. 11 and step 1100, a plurality of conductive contacts 1114, 1116, 1118, 1124, 1126, 1128 may be formed over third layer 1050 and second layer 1040, respectively. More specifically, to form a first, N-channel transistor 1110, current conducting contacts 1124, 1126 are formed over 2DEG 722 on a portion of second layer 1040 that overlies the first region 932 of GaN substrate 730, and a channel control contact 1128 is formed between the current conducting contacts 1124, 1126. The first transistor 1110 thus includes the portion of second layer 1040 overlying the first region 932, the 2DEG 722, the current carrying contacts 1124, 1126, and the channel control contact 1128. Similarly, to form a second, P-channel transistor 1120, current conducting contacts 1114, 1116 are formed over 2DHG 1012 on third layer 1050, and a channel control contact 1118 is formed between the current conducting contacts 1114, 1116. The second transistor 1120 thus includes the third layer 1050, the portion of second layer 1040 overlying the second region 934, the 2DHG 1012, the current carrying contacts 1114, 1116, and the channel control contact 1118. The portion of the 2DEG 722 within the second region 934 of the GaN substrate 730 is not considered to form a portion of the second transistor 1120. In any event, the first and second transistors 1110, 1120 form portions of another embodiment of a combination GaN IC 1105. Again, as will be discussed in conjunction with FIGS. 12-17, various additional circuit elements may then be electrically coupled to the first and second transistors 1110, 1120 to form various types of electrical circuits. Although FIGS. 12-17 illustrate embodiments of circuits that utilize the complementary GaN IC embodiment of FIG. 1, it should be understood that the circuit embodiments of FIGS. 12-17 also could utilize the complementary GaN IC embodiment of FIG. 11.

Figure 13:
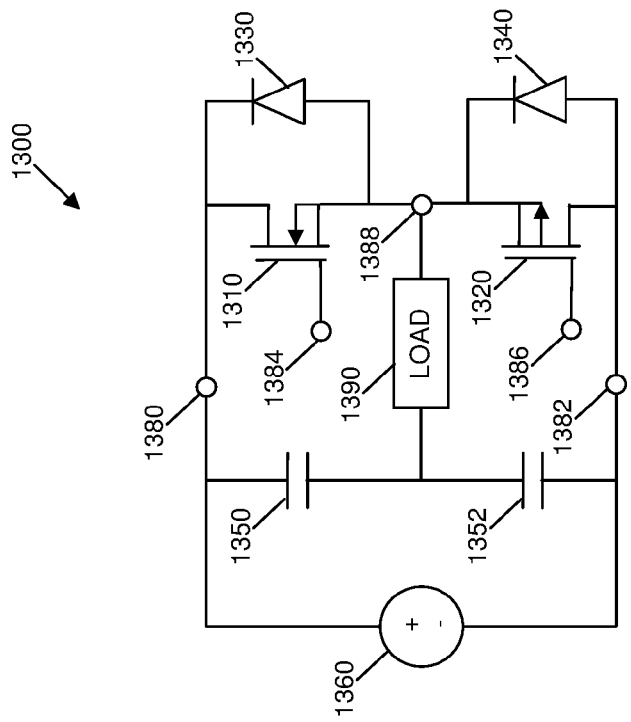
FIG. 13 is an equivalent schematic diagram of the single-phase, half-bridge inverter of FIG. 12.
Figure 12:
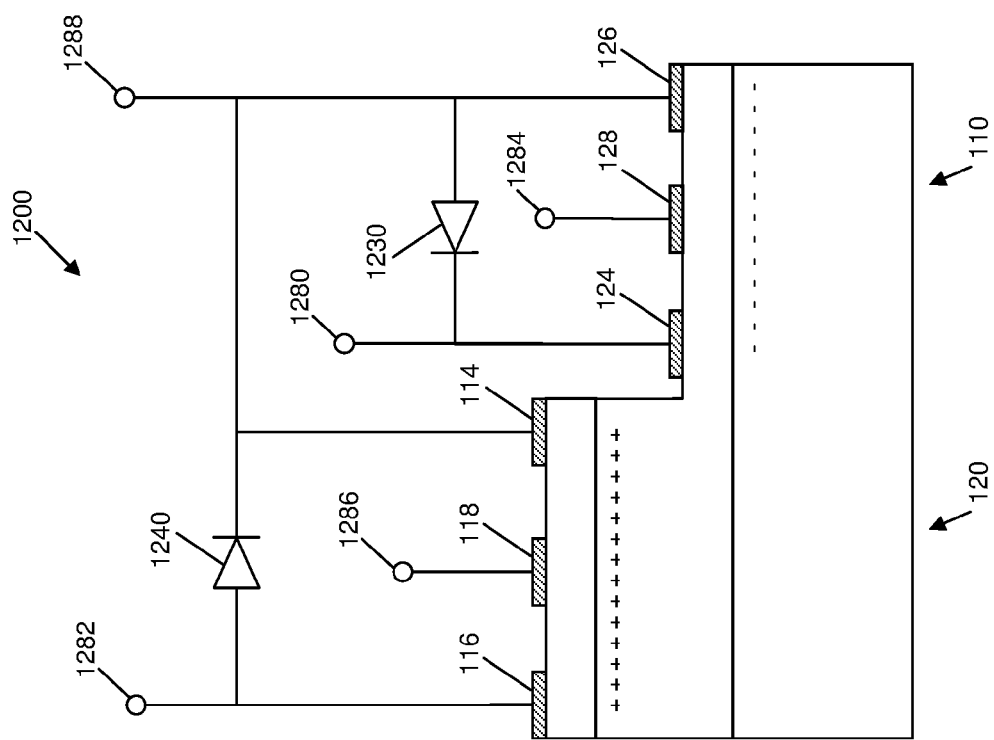
FIG. 12 illustrates the complementary GaN integrated circuit of FIG. 1 with additional electrical connections and circuit components to provide a single-phase, half-bridge inverter, in accordance with an example embodiment.

FIG. 12 illustrates the complementary GaN IC 100 of FIG. 1 with additional electrical connections and circuit components to provide a single-phase, half-bridge, voltage source inverter 1200 (i.e., a DC to AC converter), in accordance with an example embodiment, and FIG. 13 is an equivalent schematic diagram 1300 of the single-phase, half-bridge inverter 1200 of FIG. 12. Essentially, inverter 1200, 1300 is configured to produce an AC output waveform from a DC voltage source (e.g., DC voltage source 1360).

Inverter 1200, 1300 includes at least two complementary transistors 110, 120, 1310, 1320 and at least two diodes 1230, 1240, 1330, 1340, coupled together with various conductive structures as shown in FIGS. 12 and 13. In addition, according to an embodiment, inverter 1200, 1300 may include at least two capacitors 1350, 1352 (not illustrated in FIG. 12), which may function to reduce low-order current harmonics from being injected back into a voltage source 1360 (not illustrated in FIG. 12). The diodes 1230, 1240, 1330, 1340 and/or the capacitors 1350, 1352 may be monolithically formed with the transistors 110, 120, 1310, 1320, or some or all of the diodes 1230, 1240, 1330, 1340 and/or capacitors 1350, 1352 may be formed on distinct substrates and/or may be distinct discreet components.

As mentioned above, inverter 1200, 1300 is a single-phase half-bridge inverter. Other embodiments of GaN ICs may be used to form other types of inverters, as well, including but not limited to single-phase, full-bridge inverters, multi-phase inverters, current source inverters, multi-level inverters, and so on. In the half-bridge inverter 1200, 1300 embodiment illustrated in FIGS. 12 and 13, inverter 1200, 1300 includes two legs, where a first leg of the inverter 1200, 1300 includes first transistor 110, 1310 and first diode 1230, 1330, and a second leg of the inverter 1200, 1300 includes second transistor 120, 1320 and a second diode 1240, 1340. A cathode of the first diode 1230, 1330 is coupled to the first current carrying contact 124 of the first transistor 110, 1310, and an anode of the first diode 1230, 1330 is coupled to the second current carrying contact 126 of the first transistor 110, 1310. Similarly, a cathode of the second diode 1240, 1340 is coupled to the first current carrying contact 114 of the second transistor 120, 1320, and an anode of the second diode 1240, 1340 is coupled to the second current carrying contact 116 of the second transistor 120, 1320.

Inverter 1200, 1300 also includes a positive input terminal 1280, 1380, a negative input terminal 1282, 1382, a first transistor control terminal 1284, 1384, a second transistor control terminal 1286, 1386, and an output terminal 1288, 1388. The positive input terminal 1280, 1380 is coupled to the first current carrying terminal 124 of the first transistor 110, 1310, and is configured to receive a positive voltage from the voltage source 1360. The negative input terminal 1282, 1382 is coupled to the second current carrying terminal 116 of the second transistor 120, 1320, and is configured to receive a negative voltage from the voltage source 1360.

The first transistor control terminal 1284, 1384 is coupled to the channel control contact 128 of the first transistor 110, 1310, and the first transistor control terminal 1284, 1384 is configured to receive a first switch control signal from a controller (not illustrated). The second transistor control terminal 1286, 1386 is coupled to the channel control contact 118 of the second transistor 120, 1320, and the second transistor control terminal 1286, 1386 is configured to receive a second switch control signal from the controller. The first and second switch control signals are supplied so that both transistors 110, 120, 1310, 1320 are not on (i.e., in a conductive state) at the same time. More particularly, the switch control signals are modulated (e.g., using pulse width modulation, a carrier-based technique, a space-vector technique, a selective-harmonic technique, or some other modulation scheme) so as to produce near sinusoidal waveforms around a frequency of interest.

The AC output signal is produced at output terminal 1288, 1388, which is coupled to the second current carrying contact 126 of the first transistor 110, 1310 and to the first current carrying contact 114 of the second transistor 120, 1320. The output terminal 1288, 1388 is configured to provide the AC output signal to a load (e.g., load 1390, not illustrated in FIG. 12).

Figure 15:
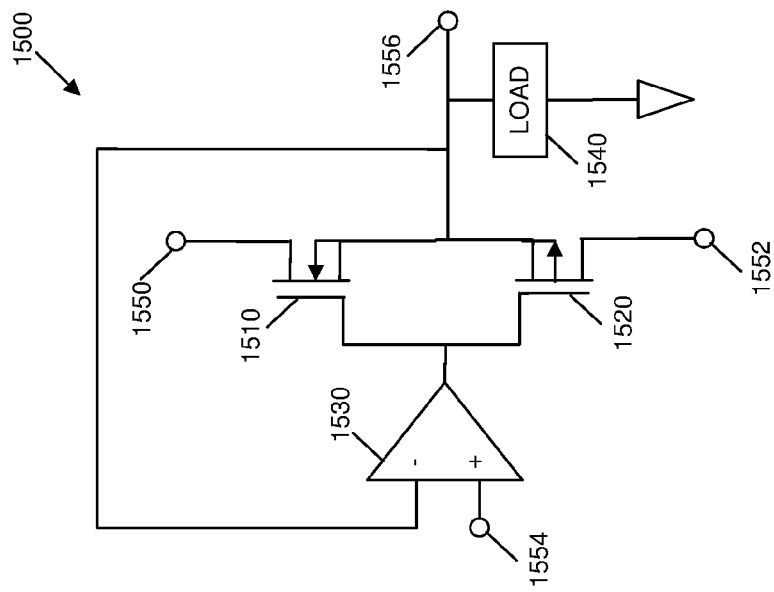
FIG. 15 is an equivalent schematic diagram of the push-pull output of FIG. 14.
Figure 14:
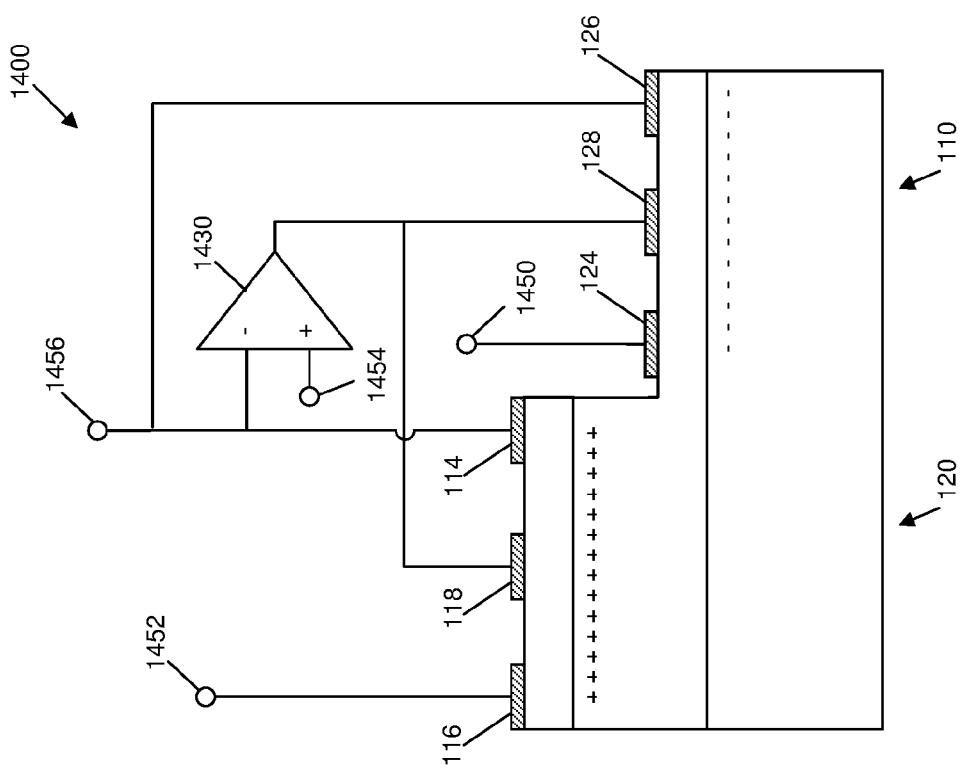
FIG. 14 illustrates the complementary GaN integrated circuit of FIG. 1 with additional electrical connections and circuit components to provide a push-pull output, in accordance with an example embodiment.

FIG. 14 illustrates the complementary GaN IC of FIG. 1 with additional electrical connections and circuit components to provide a push-pull output 1400, in accordance with an example embodiment, and FIG. 15 is an equivalent schematic diagram 1500 of the push-pull output 1400 of FIG. 14. Push-pull output 1400, 1500 is configured alternatively to supply current to, or absorb current from, a connected load (e.g., load 1540, not illustrated in FIG. 14).

Push-pull output 1400, 1500 includes at least two complementary transistors 110, 120, 1510, 1520 and a comparator 1430, 1530, coupled together with various conductive structures as shown in FIGS. 14 and 15. The comparator 1430, 1530 may be monolithically formed with the transistors 110, 120, 1510, 1520, or the comparator 1430, 1530 may be formed on a distinct substrate and/or may include distinct discreet components.

Push-pull output 1400, 1500 also includes a first power supply terminal 1450, 1550, a second power supply terminal 1452, 1552, an input terminal 1454, 1554, and an output terminal 1456, 1556. The input terminal 1454, 1554 is coupled to a first input of the comparator 1430, 1530, and a second input of the comparator 1430, 1530 is coupled to the output terminal 1456, 1556. The first power supply terminal 1450, 1550 is coupled to the first current carrying terminal 124 of the first transistor 110, 1510, and is configured to receive a first reference voltage (e.g., Vss). The second power supply terminal 1452, 1552 is coupled to the second current carrying terminal 116 of the second transistor 120, 1520, and is configured to receive a second reference voltage (e.g., $V_{DD}$ or ground). The second current carrying terminal 126 of the first transistor 110, 1510 and the first current carrying terminal 114 of the second transistor 120, 1520 are coupled together, and are also coupled to the output terminal 1456, 1556 and to the second input of the comparator 1430, 1530.

During operation, a reference voltage is provided to the input terminal 1454, 1554 (and thus to the first input terminal of the comparator 1430, 1530). The comparator 1430, 1530 also receives, at its second input terminal, the voltage provided at the output terminal 1456, 1556 to the load, and the comparator compares the two voltage values and provides a switch control signal to transistors 110, 120, 1510, 1520, accordingly. The switch control signal may cause either the first transistor 110, 1510 or the second transistor 120, 1520 to conduct current, at any given time. More specifically, when the first transistor 110, 1510 is conducting (and the second transistor 120, 1520 is not), the first transistor 110, 1510 provides current to the load 1540 from a power supply (not illustrated). Conversely, when the second transistor 120, 1520 is conducting (and the first transistor 110, 1510 is not), the second transistor 120, 1520 sinks current from the load to ground or a negative power supply.

Figure 17:
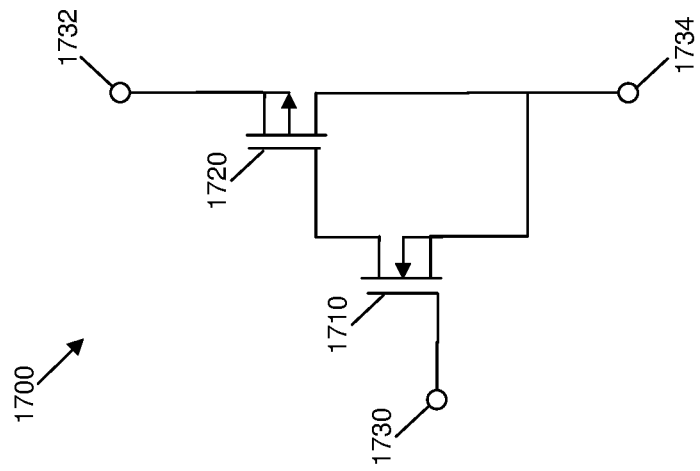
FIG. 17 is an equivalent schematic diagram of the compound transistor of FIG. 16.
Figure 16:
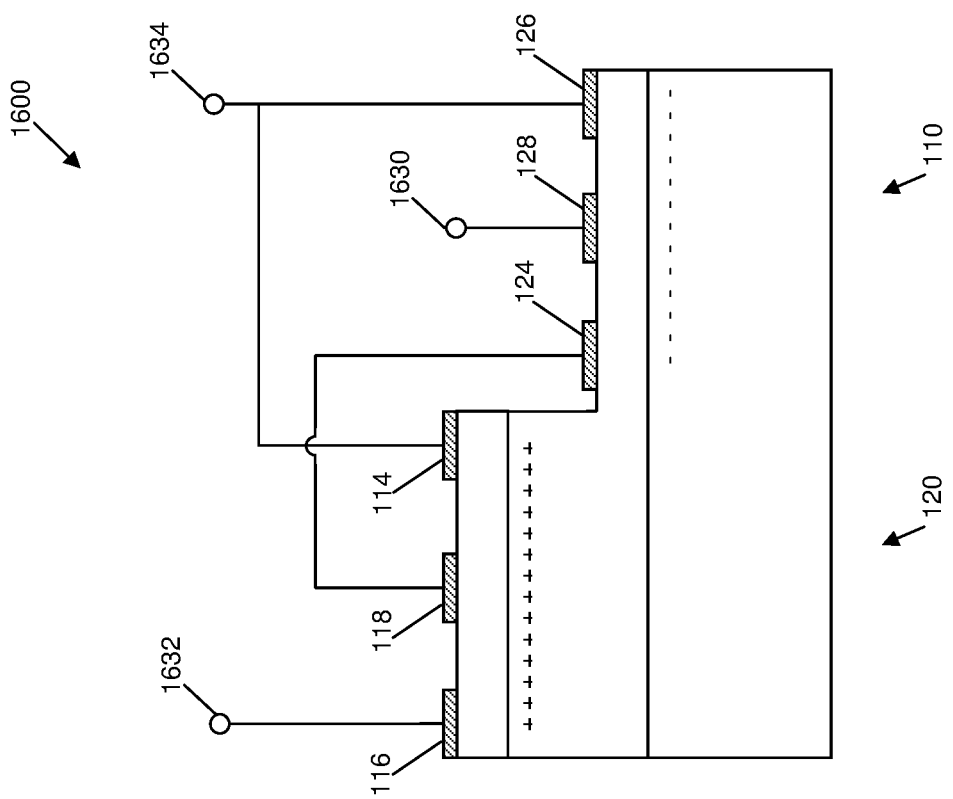
FIG. 16 illustrates the complementary GaN integrated circuit of FIG. 1 with additional electrical connections and circuit components to provide a compound transistor, in accordance with an example embodiment.

FIG. 16 illustrates the complementary GaN IC of FIG. 1 with additional electrical connections and circuit components to provide a compound transistor 1600 (also known as a Sziklai pair), in accordance with an example embodiment, and FIG. 17 is an equivalent schematic diagram 1700 of the compound transistor 1600 of FIG. 16.

Compound transistor 1600, 1700 includes at least two complementary transistors 110, 120, 1710, 1720 coupled together with various conductive structures as shown in FIGS. 16 and 17. Compound transistor 1600, 1700 also includes an input terminal 1630, 1730, a source terminal 1632, 1732, and a drain terminal 1634, 1734. The input terminal 1630, 1730 is coupled to the channel control contact 128 of the first transistor 110, 1710. The first current carrying terminal 124 of the first transistor 110, 1710 is coupled to the channel control contact 118 of the second transistor 120, 1720. The first current carrying terminal 114 of the second transistor 120 is coupled to the source terminal 1632, 1732. The second current carrying terminals 126, 116 of the first and second transistors 110, 120, 1710, 1720 are coupled to the drain terminal 1634, 1734.

Besides the above examples of circuits in which the various complementary GaN IC embodiments may be implemented, the various complementary GaN embodiments may be implemented in a variety of other types of circuits. Such circuits include, but are not limited to, AC to DC converters (rectifiers), DC to DC converters, AC to AC converters, Darlington pairs, and various other types of circuits. Accordingly, the examples given above are not intended to be limiting.

An embodiment of a monolithic integrated circuit includes a GaN layer, a second layer, and a third layer. The GaN layer has a top surface and a first bandgap. The second layer is formed over the top surface of the GaN layer and has a first portion and a second portion. The second layer has a second bandgap that is different from the first bandgap, resulting in a 2DEG in a contact region between the GaN layer and the second layer. The first portion of the second layer is formed over a first region of the GaN layer, and the second portion of the second layer is formed over a second region of the GaN layer. The third layer is formed over the second portion of the second layer. The third layer has a third bandgap that is different from the second bandgap, resulting in a 2DHG in a contact region between the second layer and the third layer.

An embodiment of an electronic circuit includes a monolithic integrated circuit that includes a GaN layer, a first transistor, and a second transistor. The GaN layer has a top surface and a first bandgap. The first transistor is of a first conductivity type, and is formed over a first region of the top surface of the GaN layer. The first transistor includes a first portion of a second layer, first and second current carrying contacts, and a first channel control contact. The second layer has a second bandgap that is different from the first bandgap, resulting in a 2DEG in a contact region between the GaN layer and the first portion of the second layer. The first and second current carrying contacts are formed over the first portion of the second layer and the first region of the top surface of the GaN layer. The first channel control contact is formed over the first portion of the second layer and the first region of the top surface of the GaN layer and between the first and second current carrying contacts. The second transistor is of a second conductivity type, and is formed over a second region of the top surface of the GaN layer. The second transistor includes a second portion of the second layer, a third layer formed over the second portion of the second layer, third and fourth current carrying contacts, and a second channel control contact. The third layer has a third bandgap that is different from the second bandgap, resulting in a 2DHG in a contact region between the second layer and the third layer. The third and fourth current carrying contacts are formed over the third layer, the second portion of the second layer, and the second region of the top surface of the GaN layer. The second channel control contact is formed over the third layer, the second portion of the second layer, and the second region of the top surface of the GaN layer and between the third and fourth current carrying contacts.

An embodiment of a method of fabricating a monolithic integrated circuit includes providing a first GaN layer, which has a first bandgap, and forming a second layer over a top surface of the GaN layer, where the second layer has a second bandgap that is different from the first bandgap, resulting in a 2DEG in a contact region between the GaN layer and the second layer. The second layer has a first portion formed over a first region of the top surface of the GaN layer, and a second portion formed over a second region of the top surface of the GaN layer. The method also includes forming a third layer over the second portion of the second layer, where the third layer has a third bandgap that is different from the second bandgap, resulting in a 2DHG in a contact region between the second layer and the third layer.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating an integrated circuit, the method comprising the steps of:
   providing a first gallium nitride (GaN) layer, wherein the GaN layer has a first bandgap, a first region, and a second region adjacent to the first region;
   forming a first sub-layer of a second layer over a top surface of the GaN layer, wherein the first sub-layer has a second bandgap that is different from the first bandgap, resulting in a two dimensional electron gas (2DEG) in a contact region between the GaN layer and the first sub-layer, wherein the first sub-layer has a first portion formed over the first region of the GaN layer, and a second portion formed over the second region of the GaN layer, and wherein the first portion of the first sub-layer has a top surface at a first height above the first region of the GaN layer;
   physically damaging a structure of the contact region between the second region of the GaN layer and the second portion of the first sub-layer to suppress the 2DEG in the contact region between the second region of the GaN layer and the second portion of the first sub-layer;
   forming a second sub-layer of the second layer over a top surface of the second portion of the first sub-layer, wherein the second sub-layer has a top surface at a second height above the GaN layer that is greater than the first height, and the second layer includes a vertical sidewall positioned between the first and second portions and extending between the top surface of the first portion of the first sub-layer and the top surface of the second sub-layer;
   forming a third layer over the second sub-layer, wherein the third layer has a third bandgap that is different from the second bandgap, resulting in a two dimensional hole gas (2DHG) in a contact region between the second sub-layer and the third layer
   forming first and second current carrying contacts over the first portion of the first sub-layer;

forming a first channel control contact over the first portion of the first portion of the first sub-layer and between the first and second current carrying contacts, wherein the first portion of the first sub-layer, the 2DEG, the first and second current carrying contacts, and the first channel control contact form portions of a first transistor having a first conductivity type;

forming third and fourth current carrying contacts over the third layer;

forming a second channel control contact over the third layer between the third and fourth current carrying contacts, wherein the third layer, the second sub-layer, the 2DHG, the third and fourth current carrying contacts, and the second channel control contact form portions of a second transistor having a second conductivity type;

coupling a positive input terminal to the first current carrying terminal of the first transistor, wherein the positive input terminal is configured to receive a first voltage from a voltage source;

coupling a negative input terminal to the fourth current carrying terminal of the second transistor, wherein the negative input terminal is configured to receive a second voltage from the voltage source;

coupling a first transistor control terminal to the first channel control contact of the first transistor, wherein the first transistor control terminal is configured to receive a first switch control signal from a controller;

coupling a second transistor control terminal to the second channel control contact of the second transistor, wherein the second transistor control terminal is configured to receive a second switch control signal from a controller;

coupling a first cathode of a first diode to the first current carrying contact of the first transistor;

coupling a first anode of the first diode to the second current carrying contact of the first transistor;

coupling a second cathode of a second diode to the third current carrying contact of the second transistor;

coupling a second anode of the second diode to the fourth current carrying contact of the second transistor; and coupling an output terminal to the second current carrying contact and the third current carrying contact to form an inverter, wherein the output terminal is configured to provide an AC signal to a load.

2. The method of claim 1, wherein physically damaging the structure of the contact region comprises performing an ion implantation process to implant ions through the second portion of the first sub-layer over the second region and into the contact region, wherein the ion implantation forms traps that suppress the 2DEG in the second region.

3. The method of claim 2, wherein performing the ion implantation process comprises:
applying mask material on the first sub-layer over the first region of the GaN layer;
implanting the ions through an opening in the mask material over the second portion of the first sub-layer.

4. The method of claim 2, wherein performing the ion implantation process comprises:
implanting ions selected from oxygen (O), argon (Ar), and other ions having non-charge-producing characteristics.

5. The method of claim 2, wherein performing the ion implantation process comprises:
implanting ions selected from magnesium (Mg), carbon (C), and other ions having charge-producing characteristics.

6. The method of claim 1, wherein the first and second sub-layers are formed from a material selected from an aluminum gallium nitride (AlGaN) alloy, an indium aluminum nitride (InAlN) alloy, and an indium gallium nitride (InGaN) alloy.

7. The method of claim 1, wherein the first and second sub-layers are formed from an aluminum gallium nitride (AlGaN) alloy having an atomic percentage of aluminum in a range of 20 percent to 30 percent.

8. The method of claim 1, wherein the first height is in a range of 15 nanometers to 30 nanometers.

9. The method of claim 8, wherein the second height is in a range of 40 nanometers to 100 nanometers.

10. The method of claim 1, wherein the third layer includes a semiconductor material doped with a p-type dopant.

11. The method of claim 1, wherein the third layer has a thickness in a range of 10 nm to 30 nm.

12. The method of claim 1, further comprising:
forming an isolation structure between the first transistor and the second transistor, wherein the isolation structure is selected from an isolation mesa, an implant region, and implant well, and a trench isolation structure.

13. A method of fabricating an integrated circuit, the method comprising the steps of:
providing a first gallium nitride (GaN) layer, wherein the GaN layer has a first bandgap, a first region, and a second region adjacent to the first region;

forming a first sub-layer of a second layer over a top surface of the GaN layer, wherein the first sub-layer has a second bandgap that is different from the first bandgap, resulting in a two dimensional electron gas (2DEG) in a contact region between the GaN layer and the first sub-layer, wherein the first sub-layer has a first portion formed over the first region of the GaN layer, and a second portion formed over the second region of the GaN layer, and wherein the first portion of the first sub-layer has a top surface at a first height above the first region of the GaN layer;

physically damaging a structure of the contact region between the second region of the GaN layer and the second portion of the first sub-layer to suppress the 2DEG in the contact region between the second region of the GaN layer and the second portion of the first sub-layer;

forming a second sub-layer of the second layer over a top surface of the second portion of the first sub-layer, wherein the second sub-layer has a top surface at a second height above the GaN layer that is greater than the first height, and the second layer includes a vertical sidewall positioned between the first and second portions and extending between the top surface of the first portion of the first sub-layer and the top surface of the second sub-layer;

forming a third layer over the second sub-layer, wherein the third layer has a third bandgap that is different from the second bandgap, resulting in a two dimensional hole gas (2DHG) in a contact region between the second sub-layer and the third layer forming first and second current carrying contacts over the first portion of the first sub-layer;

forming a first channel control contact over the first portion of the first portion of the first sub-layer and between the first and second current carrying contacts, wherein the first portion of the first sub-layer, the 2DEG, the first and second current carrying contacts, and the first channel control contact form portions of a first transistor having a first conductivity type;

forming third and fourth current carrying contacts over the third layer;

forming a second channel control contact over the third layer between the third and fourth current carrying contacts, wherein the third layer, the second sub-layer, the 2DHG, the third and fourth current carrying contacts, and the second channel control contact form portions of a second transistor having a second conductivity type;

coupling an output of a comparator to the first and second channel control contacts of the first and second transistors;

coupling an input terminal coupled to a first input of the comparator;

coupling a first power supply terminal to the first current carrying terminal of the first transistor;

coupling a second power supply terminal to the fourth current carrying terminal of the second transistor;

coupling an output terminal to a second input of the comparator; and coupling the second current carrying terminal of the first transistor and the third current carrying terminal of the second transistor to the output terminal to form a push-pull output circuit.

14. The method of claim 13, wherein physically damaging the structure of the contact region comprises performing an ion implantation process to implant ions through the second portion of the first sub-layer over the second region and into the contact region, wherein the ion implantation forms traps that suppress the 2DEG in the second region.

15. The method of claim 13, wherein the first and second sub-layers are formed from a material selected from an aluminum gallium nitride (AlGaN) alloy, an indium aluminum nitride (InAlN) alloy, and an indium gallium nitride (InGaN) alloy.

16. The method of claim 13, further comprising:
forming an isolation structure between the first transistor and the second transistor, wherein the isolation structure is selected from an isolation mesa, an implant region, and implant well, and a trench isolation structure.

17. A method of fabricating an integrated circuit, the method comprising the steps of:
providing a first gallium nitride (GaN) layer, wherein the GaN layer has a first bandgap, a first region, and a second region adjacent to the first region;

forming a first sub-layer of a second layer over a top surface of the GaN layer, wherein the first sub-layer has a second bandgap that is different from the first bandgap, resulting in a two dimensional electron gas (2DEG) in a contact region between the GaN layer and the first sub-layer, wherein the first sub-layer has a first portion formed over the first region of the GaN layer, and a second portion formed over the second region of the GaN layer, and wherein the first portion of the first sub-layer has a top surface at a first height above the first region of the GaN layer;

physically damaging a structure of the contact region between the second region of the GaN layer and the second portion of the first sub-layer to suppress the 2DEG in the contact region between the second region of the GaN layer and the second portion of the first sub-layer;

forming a second sub-layer of the second layer over a top surface of the second portion of the first sub-layer, wherein the second sub-layer has a top surface at a second height above the GaN layer that is greater than the first height, and the second layer includes a vertical sidewall positioned between the first and second portions and extending between the top surface of the first portion of the first sub-layer and the top surface of the second sub-layer;

forming a third layer over the second sub-layer, wherein the third layer has a third bandgap that is different from the second bandgap, resulting in a two dimensional hole gas (2DHG) in a contact region between the second sub-layer and the third layer forming first and second current carrying contacts over the first portion of the first sub-layer;

forming a first channel control contact over the first portion of the first portion of the first sub-layer and between the first and second current carrying contacts, wherein the first portion of the first sub-layer, the 2DEG, the first and second current carrying contacts, and the first channel control contact form portions of a first transistor having a first conductivity type;

forming third and fourth current carrying contacts over the third layer;

forming a second channel control contact over the third layer between the third and fourth current carrying contacts, wherein the third layer, the second sub-layer, the 2DHG, the third and fourth current carrying contacts, and the second channel control contact form portions of a second transistor having a second conductivity type;

coupling an input terminal to the channel control contact of the first transistor;

coupling the first current carrying terminal of the first transistor to the channel control contact of the second transistor;

coupling a source terminal to the third current carrying terminal of the second transistor; and coupling a drain terminal to the second current carrying terminal of the first transistor and to the fourth current carrying terminal of the second transistor to form a compound transistor.

18. The method of claim 17, wherein physically damaging the structure of the contact region comprises performing an ion implantation process to implant ions through the second portion of the first sub-layer over the second region and into the contact region, wherein the ion implantation forms traps that suppress the 2DEG in the second region.

19. The method of claim 17, wherein the first and second sub-layers are formed from a material selected from an aluminum gallium nitride (AlGaN) alloy, an indium aluminum nitride (InAlN) alloy, and an indium gallium nitride (InGaN) alloy.

20. The method of claim 17, further comprising:
forming an isolation structure between the first transistor and the second transistor, wherein the isolation structure is selected from an isolation mesa, an implant region, and implant well, and a trench isolation structure.

* * * * *